United States Patent
Kim et al.

(10) Patent No.: US 9,719,186 B2
(45) Date of Patent: Aug. 1, 2017

(54) TWO-DIMENSIONAL LARGE-AREA GROWTH METHOD FOR CHALCOGEN COMPOUND, METHOD FOR MANUFACTURING CMOS-TYPE STRUCTURE, FILM OF CHALCOGEN COMPOUND, ELECTRONIC DEVICE COMPRISING FILM OF CHALCOGEN COMPOUND, AND CMOS-TYPE STRUCTURE

(71) Applicant: UNIVERSITY-INDUSTRY COOPERATION GROUP OF KYUNG HEE UNIVERSITY, Yongin-si, Gyeonggi-do (KR)

(72) Inventors: Sun-Kook Kim, Yongin-si (KR); Jong-Soo Rhyee, Yongin-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/368,157

(22) Filed: Dec. 2, 2016

(65) Prior Publication Data

US 2017/0081778 A1 Mar. 23, 2017

Related U.S. Application Data

(62) Division of application No. 14/778,863, filed as application No. PCT/KR2014/002315 on Mar. 19, 2014, now Pat. No. 9,551,087.

(30) Foreign Application Priority Data

Mar. 22, 2013 (KR) ........................ 10-2013-0030687

(51) Int. Cl.
*H01L 21/8238* (2006.01)
*C30B 1/10* (2006.01)
(Continued)

(52) U.S. Cl.
CPC .............. *C30B 1/10* (2013.01); *C01B 19/007* (2013.01); *C30B 1/04* (2013.01); *C30B 1/08* (2013.01);
(Continued)

(58) Field of Classification Search
CPC ............. H01L 21/02568; H01L 27/092; H01L 21/02667
See application file for complete search history.

(56) References Cited

U.S. PATENT DOCUMENTS 5,958,358 A 9/1999 Tenne et al.

FOREIGN PATENT DOCUMENTS

JP 7-69782 A 3/1995

OTHER PUBLICATIONS

Dominik Lembke, et al., "Breakdown of High-Performance Monolayer MoS2 Transistors", ACS Nano, 2012, pp. 10070-10075, vol. 6, No. 11.
(Continued)

*Primary Examiner* — Elias M Ullah
(74) *Attorney, Agent, or Firm* — Sughrue Mion, PLLC

(57) ABSTRACT

Provided is a two-dimensional large-area growth method for a chalcogen compound, the method including: depositing a film of a transition metal element or a Group V element on a substrate; thereafter, uniformly diffusing a vaporized chalcogen element, a vaporized chalcogen precursor compound or a chalcogen compound represented by $M'X'_{2+\delta}$ within the film; and, thereafter, forming a film of a chalcogen com-
(Continued)

pound represented by $MX_2$ by forming the chalcogen compound represented by $MX_2$ through post-heating.

6 Claims, 9 Drawing Sheets

(51) Int. Cl.
    *C30B 1/04*     (2006.01)
    *C30B 1/08*     (2006.01)
    *C30B 29/46*     (2006.01)
    *H01L 21/02*     (2006.01)
    *C01B 19/00*     (2006.01)

(52) U.S. Cl.
    CPC ........ *C30B 29/46* (2013.01); *H01L 21/02568* (2013.01); *H01L 21/02667* (2013.01); *H01L 21/823807* (2013.01)

(56) References Cited

OTHER PUBLICATIONS

International Search Report of PCT/KR2014/002315, dated Jun. 27, 2014. [PCT/ISA/210].
Korean Office Action of Korean Patent Application No. 10-2013-0030687, dated Apr. 28, 2014.

TWO-DIMENSIONAL LARGE-AREA GROWTH METHOD FOR CHALCOGEN COMPOUND, METHOD FOR MANUFACTURING CMOS-TYPE STRUCTURE, FILM OF CHALCOGEN COMPOUND, ELECTRONIC DEVICE COMPRISING FILM OF CHALCOGEN COMPOUND, AND CMOS-TYPE STRUCTURE

CROSS-REFERENCE TO RELATED APPLICATIONS

This application is a divisional application of the U.S. patent application Ser. No. 14/778,863, filed on Sep. 21, 2015 which is a National Stage application of International Application No. PCT/KR2014/002315, filed on Mar. 19, 2014, which claims priority from Korean Patent Application No. 10-2013-0030687, filed on Mar. 22, 2013, the contents of all of which are incorporated herein by reference in their entirety.

BACKGROUND OF THE INVENTION

1. Field of the Invention

The present invention relates to a two-dimensional large-area growth method for a chalcogen compound, a method of manufacturing a CMOS-type structure, a film of a chalcogen compound represented by $MX_2$ (wherein M is a transition metal element or a Group V element and X is a chalcogen element), an electronic device including a film of a chalcogen compound represented by $MX_2$ and a CMOS-type structure.

This research was supported in part by the National Research Foundation of Korea (NRF-2013M3C1A3059590, NRF-2014M3A9D7070732).

This research was supported by Basic Science Research Program through the National Research Foundation of Korea (NRF) funded by the Ministry of Science, ICT & Future Planning (No. 2015R1A5A1037548).

This research was supported by the Commercializations Promotion Agency for R&D Outcomes (COMPA) funded by the Ministry of Science, ICT and Future Planning (MISP).

2. Description of the Related Art

Chalcogen compounds such as transition metal chalcogen compounds form a common crystalline structure, have electrically, magnetically and optically large anisotropy, and exhibit a variety of unusual properties. Understanding for properties of such chalcogen compounds and application thereof have been interested.

There is a need to grow a two-dimensional plate-type chalcogen compound having semiconductor-like properties on a large-area substrate by growing such chalcogen compounds to a large area. However, there is limitation of low mobility when a solution process is performed using a known method, and there are a problem of slow growth and limitation in obtaining a uniform film upon application of chemical vapor deposition method wherein a chalcogen compound is deposited through chemical vapor deposition of a precursor compound.

SUMMARY OF THE INVENTION

Therefore, the present invention has been made in view of the above problems, and it is an object of the present invention to provide a two-dimensional large-area growth method for a chalcogen compound exhibiting a high growth speed.

It is another object of the present invention to provide a method of manufacturing a CMOS-type structure, the method applying the two-dimensional large-area growth method for a chalcogen compound.

It is another object of the present invention to provide a uniform chalcogen compound film having high flexibility and mobility.

It is another object of the present invention to provide an electronic device including the chalcogen compound film.

It is a further object of the present invention to provide a CMOS-type structure manufactured according to the method of manufacturing the CMOS-type structure.

In accordance with an aspect of the present invention, the above and other objects can be accomplished by the provision of a two-dimensional large-area growth method for a chalcogen compound, the method comprising:

forming a film of a transition metal element or a Group V element by depositing the transition metal element or the Group V element on a substrate;

diffusing the chalcogen element, the chalcogen precursor compound or the chalcogen compound represented by $M'X'_{2+\delta}$ into the film of the transition metal element or the Group V element by contacting through vaporization at least one selected from the group consisting of chalcogen element, a chalcogen precursor compound and a chalcogen compound represented by $M'X'_{2+\delta}$ and combinations thereof with the film of the transition metal element or the Group V element, wherein M' is a transition metal element or a Group V element, X' is a chalcogen element, and $0 \leq \delta \leq 0.5$; and forming a film of the chalcogen compound represented by $MX_2$ by post-heating the film of the transition metal element or the Group V element including the resultant diffused chalcogen element, chalcogen precursor compound or chalcogen compound represented by $M'X'_{2+\delta}$, wherein M is a transition metal element or a Group V element and X is a chalcogen element.

The transition metal may be at least one selected from the group including Cr, Mo, W, Sn and combinations thereof, and the Group V element may be at least one selected from the group including As, Sb, Bi and combinations thereof.

The each chalcogen element may be at least one selected from the group including S, Se, Te and combinations thereof, and the chalcogen precursor compound is at least one selected from the group including $SO_2$, $H_2S$, $H_2Se$, $SeO_2$, $SeF_4$, $TeO_3$, $TeO_2$, $TeF_4$ and combinations thereof.

The film of the transition metal element or the Group V element is deposited to a thickness of about 1 nm to about 50 μm on the substrate.

The film of the transition metal element or the Group V element may be deposited and formed through a physical or chemical vapor-phase synthesis method.

The vaporized chalcogen element, chalcogen precursor compound, or chalcogen compound represented by $M'X'_{2+\delta}$ vaporized into the film of the transition metal element or the Group V element through a physical or chemical vapor-phase synthesis method may be diffused using at least one raw material selected from the chalcogen element, the chalcogen precursor or the chalcogen compound represented by $M'X'_{2+\delta}$ and combinations thereof.

The chalcogen element, the chalcogen precursor compound or the chalcogen compound represented by $M'X'_{2+\delta}$ may be diffused into the film of the transition metal element or the Group V element at about 100 to about 1500° C. by contacting through vaporization the chalcogen element, the chalcogen precursor compound or the chalcogen compound represented by $M'X'_{2+\delta}$ with the film of the transition metal element or the Group V element.

The chalcogen element, the chalcogen precursor compound or the chalcogen compound represented by $M'X'_{2+\delta}$ vaporized into the film of the transition metal element or the Group V element may be diffused through a method selected from the group consisting of chemical vapor deposition (CVD), thermal CVD, plasma enhanced chemical vapor deposition (PECVD), low pressure chemical vapor deposition (LPCVD), atomic layer deposition (ALD), pulsed laser deposition (PLD), sputtering and combinations thereof, using at least one raw material selected from the chalcogen element, the chalcogen precursor or the chalcogen compound represented by $M'X'_{2+\delta}$ and combinations thereof.

The vaporized chalcogen element, chalcogen precursor compound or chalcogen compound represented by $M'X'_{2+\delta}$ may be migrated by a carrier gas and diffused into the film of the transition metal element or the Group V element.

The carrier gas may include at least one selected from the group including iodine, bromine and combinations thereof.

The raw material may further include a carrier gas.

In the film of the transition metal element or the Group V element comprising the diffused chalcogen element, precursor compound or chalcogen compound represented by $M'X'_{2+\delta}$, an atom ratio of the chalcogen element to the transition metal element or the Group V element may be greater than 2.

Upon the post-heating, a large amount of the chalcogen element and a remainder of the precursor compound may be vaporized.

Upon the post-heating, the carrier gas may be vaporized.

The film of the chalcogen compound represented by $MX_2$ formed through the post-heating may be a single-crystalline film or a poly-crystalline film.

The post-heating may be carried out at about 100 to about 1500° C.

The substrate may include at least one selected from the group including a glass substrate, a Si substrate, a quartz substrate, a sapphire substrate and combinations thereof.

The substrate may be a rigid substrate or a flexible substrate.

The two-dimensional large-area growth method for the chalcogen compound may further comprise recrystallizing the chalcogen compound represented by $MX_2$ by annealing the film of the chalcogen compound represented by $MX_2$.

The recrystallizing may be carried out through energy beam irradiation.

In accordance with another aspect of the present invention, there is provided a method of manufacturing a CMOS-type structure, the method comprising:

forming a patterned film of a first transition metal element or a first Group V element on a substrate by patterning and depositing a first n-type transition metal element or the first Group V element on the substrate;

forming a patterned film of a second transition metal element or a second Group V element on a substrate by patterning and depositing a second p-type transition metal element or the second Group V element on the substrate;

diffusing the chalcogen element, the chalcogen precursor compound or the chalcogen compound represented by $M'X'_{2+\delta}$ into the patterned film of the first transition metal element or the first Group V element and the patterned film of the second transition metal element or the second Group V element by contacting through vaporization at least one selected from the group consisting of a chalcogen element, a chalcogen precursor compound and a chalcogen compound represented by $M'X'_{2+\delta}$ and combinations thereof with the patterned film of the first transition metal element or the first Group V element and the patterned film of the second transition metal element or the second Group V element, wherein M' is a transition metal element or a Group V element, X' is a chalcogen element, and $0 \leq \delta \leq 0.5$; and obtaining a complementary metal oxide semiconductor (CMOS)-type structure comprising an N channel (such as $MoS_2$, $MoSe_2$, $MoTe_2$ etc.) metal oxide semiconductor (NMOS) and a P channel (such as $WS_2$, $WSe_2$, $WTe_2$ etc.) metal oxide semiconductor (PMOS) by forming a chalcogen compound represented by $MX_2$ through post-heating of the patterned film comprising the diffused chalcogen element chalcogen precursor compound or chalcogen compound represented by $M'X'_{2+\delta}$ and thus by forming a patterned film of the chalcogen compound represented by $MX_2$, wherein M is a transition metal element or a Group V element and X is a chalcogen element.

The vaporized chalcogen element, chalcogen precursor compound, or chalcogen compound represented by $M'X'_{2+\delta}$ vaporized into the patterned film through a physical or chemical vapor-phase synthesis method may be diffused using at least one raw material selected from the chalcogen element, the chalcogen precursor or the chalcogen compound represented by $M'X'_{2+\delta}$ and combinations thereof.

The chalcogen element, the chalcogen precursor compound or the chalcogen compound represented by $M'X'_{2+\delta}$ vaporized into the patterned film may be diffused through a method selected from the group consisting of chemical vapor deposition (CVD), thermal CVD, plasma enhanced chemical vapor deposition (PECVD), low pressure chemical vapor deposition (LPCVD), atomic layer deposition (ALD), pulsed laser deposition (PLD), sputtering and combinations thereof, using at least one raw material selected from the chalcogen element, the chalcogen precursor or the chalcogen compound represented by $M'X'_{2+\delta}$ and combinations thereof.

The vaporized chalcogen element, chalcogen precursor compound or chalcogen compound represented by $M'X'_{2+\delta}$ diffused into the patterned films may be migrated by a carrier gas and diffused into the film.

The raw material may further include a carrier gas.

The carrier gas may include at least one selected from the group comprising iodine (I), bromine (Br) and combinations thereof.

In the patterned film including the diffused chalcogen element, precursor compound or chalcogen compound represented by $M'X'_{2+\delta}$, an atom ratio of the chalcogen element to a total of the transition metal element or the Group V element may be greater than 2.

The substrate may be at least one selected from the group including a glass substrate, a Si substrate, a quartz substrate, a sapphire substrate and combinations thereof.

The substrate may be a rigid substrate or a flexible substrate.

The method of manufacturing a CMOS-type structure may further include recrystallizing the chalcogen compound represented by $MX_2$ by annealing the CMOS-type structure obtained through the post-heating.

In accordance with another aspect of the present invention, there is provided a film of a chalcogen compound represented by $MX_2$ prepared through the two-dimensional large-area growth method, wherein M is a transition metal element or a Group V element and X is a chalcogen element.

The chalcogen compound represented by $MX_2$ may include at least one selected from the group consisting of $MoS_2$, $MoSe_2$, $WSe_2$, $MoTe_2$, $SnSe_2$ and combinations thereof.

The film of the chalcogen compound represented by $MX_2$ may be a crystalline film having a single-layer structure or a multi-layer structure.

The film of the chalcogen compound represented by $MX_2$ may be a single-crystalline film or a poly-crystalline film.

In accordance with another aspect of the present invention, there is provided an electronic device comprising a film of a chalcogen compound represented by $MX_2$ prepared through the two-dimensional large-area growth method, wherein M is a transition metal element or a Group V element and X is a chalcogen element.

The electronic device may be a transistor or a diode.

The electronic device may be a transistor comprising a plurality of electrodes comprising a gate, a drain and a source, and a semiconductor channel formed between the drain and the source electrode due to the film of the chalcogen compound represented by $MX_2$.

In accordance with a further aspect of the present invention, there is provided a CMOS-type structure manufactured according to the method of manufacturing a CMOS-type structure.

The CMOS-type structure may be used in an invertor, a logic element, a memory, a display, a backplane, RF, AC or DC.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Exemplary embodiments will now be described more fully with reference to the accompanying drawings to clarify aspects, features and advantages of the inventive concept. This invention may, however, be embodied in many different forms and should not be construed as limited to the exemplary embodiments set forth herein.

In an embodiment of the present invention, provided is a two-dimensional large-area growth method for a chalcogen compound, the method comprising: forming a film of a transition metal element or a Group V element by depositing the transition metal element or the Group V element on a substrate; diffusing the chalcogen element, the chalcogen precursor compound or the chalcogen compound represented by $M'X'_{2+\delta}$ into the film of the transition metal element or the Group V element by contacting through vaporization at least one selected from the group consisting of a chalcogen element, a chalcogen precursor compound and a chalcogen compound represented by $M'X'_{2+\delta}$ and combinations thereof with the film of the transition metal element or the Group V element; and forming a film of the chalcogen compound represented by $MX_2$ by post-heating the film of the transition metal element or the Group V element including the resultant diffused chalcogen element, chalcogen precursor compound or chalcogen compound represented by $M'X'_{2+\delta}$, wherein M is a transition metal element or a Group V element and X is a chalcogen element, wherein M' is a transition metal element or a Group V element, X' is a chalcogen element, and $0 \leq \delta \leq 0.5$.

The chalcogen compound represented by $MX_2$ is a material forming two-dimensional nanoplate structure, and may be usefully applied as a next-generation semiconductor film material having high flexibility and mobility.

Figure 2:
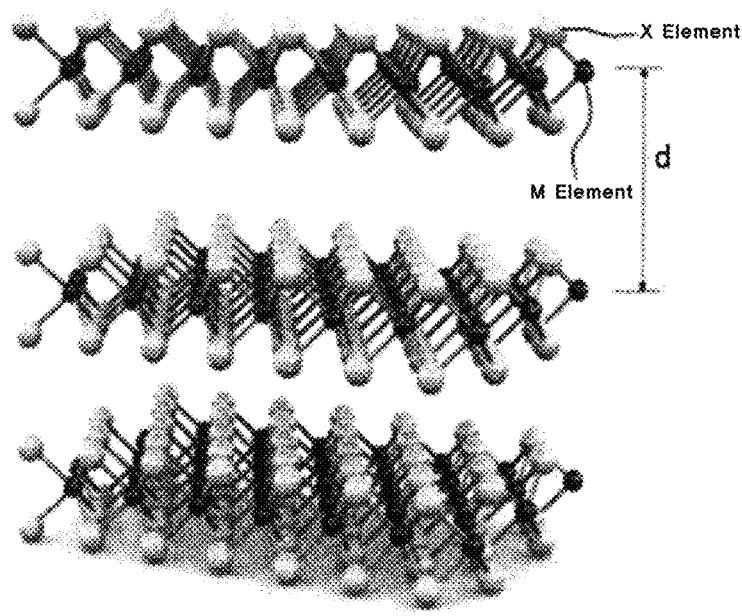
FIG. 2 is a schematic view illustrating a multi-layer chalcogen compound structure represented by $MX_2$, where M is a transition metal element or a Group V element and X is a chalcogen element.

FIG. 2 illustrated a schematic view of a multi-layer crystal structure of the chalcogen compound represented by $MX_2$. As illustrated in FIG. 2, the chalcogen compound represented by $MX_2$ may form a single-layer crystal in which an M element and an X element are two-dimensionally covalent-bonded. Such a single-layer is vertically stacked and thus a multi-layer crystal may be formed through van der Waals between layers. Upon formation of the multi-layer crystal, the thickness (d) between layers in $MoS_2$ may be approximately 6.5 Å.

A film obtained according to the two-dimensional large-area growth method for a chalcogen compound may be a single-layer or multi-layer film formed from the chalcogen compound represented by $MX_2$.

A large-area film may be obtained by growing the chalcogen compound represented by $MX_2$ into a large-area film according to the two-dimensional large-area growth method for a chalcogen compound. Such a chalcogen compound film may be usefully used as a thin-film semiconductor material.

A film of the chalcogen compound represented by $MX_2$ obtained according to the two-dimensional large-area growth method for a chalcogen compound is uniform and has high mobility and crystallinity. In addition, growth speed thereof is high.

The chalcogen element and the chalcogen compound represented by $M'X'_{2+\delta}$ may be used as, for example, a raw material of a solid such as a powder, and the chalcogen precursor compound may be used as a gas.

In particular, the transition metal may be at least one selected from the group including Cr, Mo, W, Sn and combinations thereof.

In particular, the Group V element may be at least one selected from the group including As, Sb, Bi and combinations thereof.

In particular, the each chalcogen element may be at least one selected from the group including S, Se, Te and combinations thereof.

In particular, examples of the chalcogen precursor compound include sulfur-containing gases such as $SO_2$ and $H_2S$, selenium-containing gases such as $H_2Se$, $SeO_2$ and $SeF_4$, tellurium-containing gases such as $TeO_3$, $TeO_2$ and $TeF_4$, and combinations thereof.

In particular, the chalcogen compound represented by $MX_2$ and $M'X'_{2+\delta}$ may include at least one selected from the group consisting of $MoS_2$, $WS_2$, $MoSe_2$, $WSe_2$, $MoTe_2$, $SnSe_2$ and combinations thereof.

In regard to the two-dimensional large-area growth method for a chalcogen compound, the film of the transition metal element or a Group V element is first deposited on the substrate. Here, the film of the transition metal element or the Group V element may have a thickness of about 1 nm to about 50 μm. The film of the transition metal element or the Group V element is formed within this range and, thereafter, the vaporized chalcogen element, chalcogen precursor compound or the chalcogen compound represented by $M'X'_{2+\delta}$ may be uniformly diffused within the film.

The film of the transition metal element or the Group V element may be deposited through a publicly known method, e.g., a physical or chemical vapor-phase synthesis method, without limitation. In particular, the film may be deposited through chemical vapor deposition (CVD), thermal CVD, plasma enhanced chemical vapor deposition (PECVD), low pressure chemical vapor deposition (LP-CVD), atomic layer deposition (ALD), pulsed laser deposition (PLD), sputtering, or the like.

Subsequently, the chalcogen element, chalcogen precursor compound or chalcogen compound represented by $M'X'_{2+\delta}$ is diffused into the film of the transition metal element or the Group V element.

In an embodiment, at least one selected from the group consisting of the chalcogen element, the chalcogen precursor or the chalcogen compound represented by $M'X'_{2+\delta}$ and combinations thereof as a raw material may be diffused into the film of the transition metal element or the Group V element through a physical or chemical vapor-phase synthesis method using.

In particular, the vaporized chalcogen element, chalcogen precursor or chalcogen compound represented by $M'X'_{2+\delta}$ may be diffused into the film of the transition metal element or the Group V element through a method selected from the group consisting of chemical vapor deposition (CVD), thermal CVD, plasma enhanced chemical vapor deposition (PECVD), low pressure chemical vapor deposition (LP-CVD), atomic layer deposition (ALD), pulsed laser deposition (PLD), sputtering and combinations thereof.

Vaporization contacting the chalcogen element, the chalcogen precursor or the chalcogen compound represented by $M'X'_{2+\delta}$ with the film of the transition metal element or the Group V element to diffuse the same into the film of the transition metal element or the Group V element may be carried out at, for example, about 100° C. to about 1500° C.

The vaporized chalcogen element, chalcogen precursor or chalcogen compound represented by $M'X'_{2+\delta}$ diffused into the film of the transition metal element or the Group V element is migrated by a carrier gas and may be diffused into the film.

When the chemical vapor deposition method (CVD) and a modified chemical vapor deposition method are used, a raw material of the chalcogen element or chalcogen compound and a carrier gas may be mixed and used.

The carrier gas may include at least one selected from the group including iodine (I), bromine (Br) and combinations thereof.

A raw material including at least one selected from the group consisting of the chalcogen element, the chalcogen precursor compound, the vaporized chalcogen compound represented by $M'X'_{2+\delta}$ and combinations thereof may be used within a amount range within which an atom ratio of the chalcogen element to the resultant film of the transition metal element or the Group V element including the diffused chalcogen element or chalcogen compound is greater than 2.

When the film of the transition metal element or the Group V element including the diffused chalcogen element, precursor compound or chalcogen compound represented by $M'X'_{2+\delta}$ is post-heated, a chalcogen compound represented by $MX_2$ is formed. Here, as described above, the atom ratio of the chalcogen element to the transition metal element or the Group V element is greater than 2, and thus, remainders of large amounts of the chalcogen element and chalcogen precursor compound is vaporized due to heat.

Upon the post-heating, the carrier gas is vaporized together.

The post-heating may be carried out about 100 to about 1500□.

Depending upon temperature generated through the post-heating, single-crystalline, poly-crystalline or noncrystalline chalcogen compound film may be formed.

In an embodiment, the film of the chalcogen compound represented by $MX_2$ may form a crystalline film having a single-layer structure or a multi-layer structure.

In another embodiment, the film of the chalcogen compound represented by $MX_2$ formed through the post-heating may be a single-crystalline film or a poly-crystalline film.

The film of the chalcogen compound represented by $MX_2$ formed through the post-heating may have a thickness of about 1 nm to about 50 μm.

A substrate on which the film of the transition metal element or the Group V element is formed may include at least one selected from the group including glass, a substrate formed with an inorganic material (Si, quartz, sapphire, or the like) and combinations thereof.

In regard to the two-dimensional large-area growth method for a chalcogen compound, the substrate may be a rigid substrate or a flexible substrate without limitation.

As described above, a film prepared through the two-dimensional large-area growth method for a chalcogen compound may be formed into a single-crystalline type, a poly-crystalline type or noncrystalline type depending upon post-heating temperature. In order to increase crystallinity of such a noncrystalline film or a film having amorphous and crystalline properties, annealing may be additionally carried out.

The two-dimensional large-area growth method for the chalcogen compound may further comprise recrystallizing the chalcogen compound represented by $MX_2$ by annealing the film of the chalcogen compound represented by $MX_2$.

In an embodiment, the recrystallizing may be carried out through energy beam irradiation.

With regard to the annealing, by performing energy beam irradiation instead of heat treatment, damage of a substrate may be prevented while increasing mobility of a chalcogen compound. In particular, mobility of a material may be enhanced by recrystallizing instantaneously a noncrystalline material to a single-crystalline or a poly-crystalline material through femtosecond laser annealing.

The laser annealing may facilitate crystallization of a chalcogen compound as a channel material and may decrease contact resistance by functioning in a bonding portion between a semiconductor and a conductor to enhance electrical conductivity.

Figure 5:
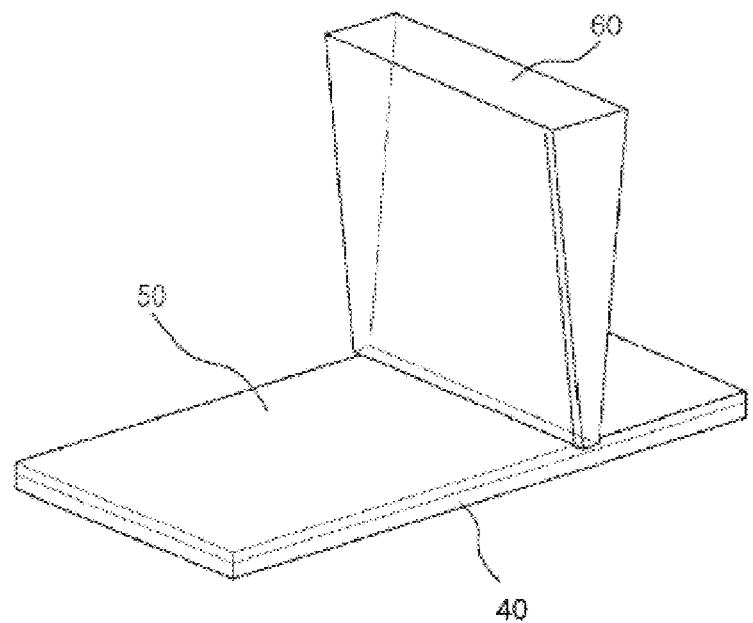
FIG. 5 is a view illustrating an excimer laser beam irradiated to a chalcogen compound.
Figure 6:
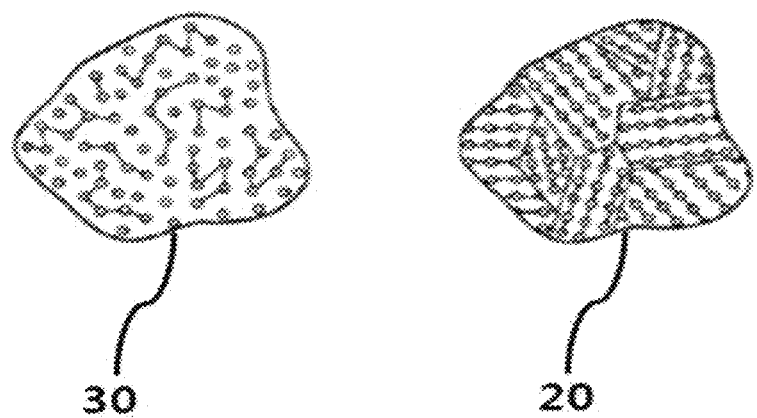
FIG. 6 is a view schematically illustrating that an amorphous material is recrystallized into a poly-crystalline material through laser beam irradiation and thus a grain boundary is widened.

As illustrated in FIG. 5, the laser annealing may be excimer laser annealing. In FIG. 5, a chalcogen compound that may be included as an amorphous material in a film is recrystallized to a single-crystalline or a poly-crystalline material by irradiating a laser beam 60 to a film of a chalcogen compound formed on a substrate 40. The film of the chalcogen compound may be a film formed after the post-heating of the two-dimensional large-area growth method. As illustrated in FIG. 6, a recrystallized single-layer or multi-layer chalcogen compound is recrystallized from noncrystalline 30 to poly-crystalline 20 and thus a grain boundary is extended. Accordingly, scattering is prevented and thus mobility is increased. In addition, bonding resistance of a bonding portion between a multi-layer chalcogen compound and a source/drain electrode is enhanced through excimer laser annealing and thus mobility is accelerated.

The recrystallizing described above may be carried out through femtosecond laser annealing, and a chalcogen compound is recrystallized without mechanical damage for a substrate, thereby forming a semiconductor channel material.

Figure 7:
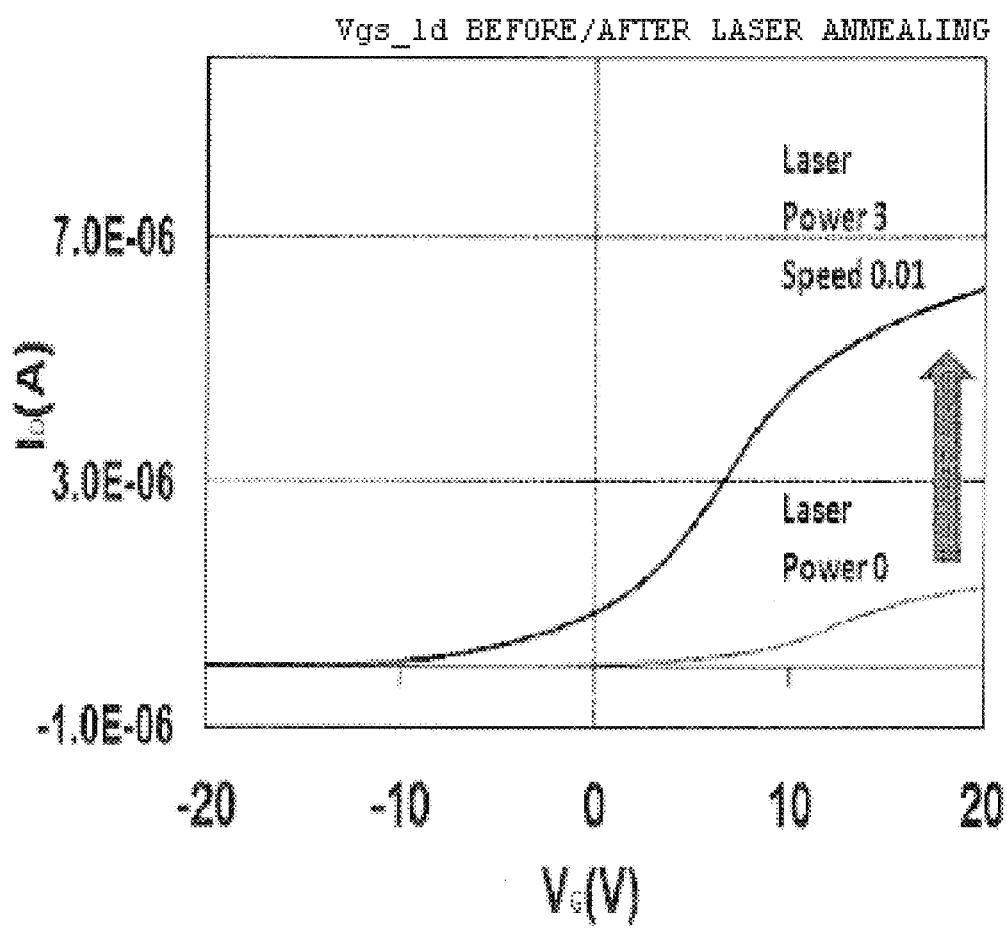
FIGS. 7, 8 and 9 are graphs illustrating characteristics before/after laser beam irradiation.
Figure 8:
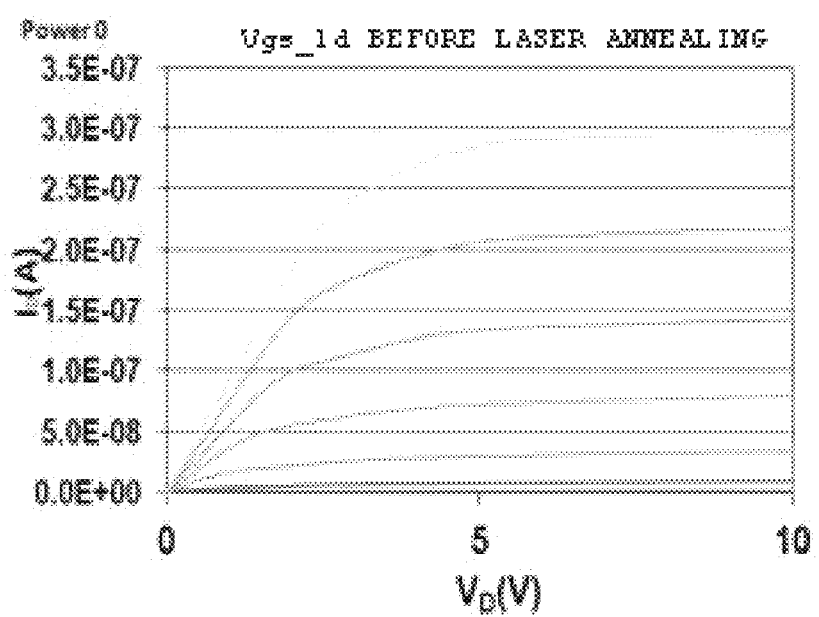
Figure 9:
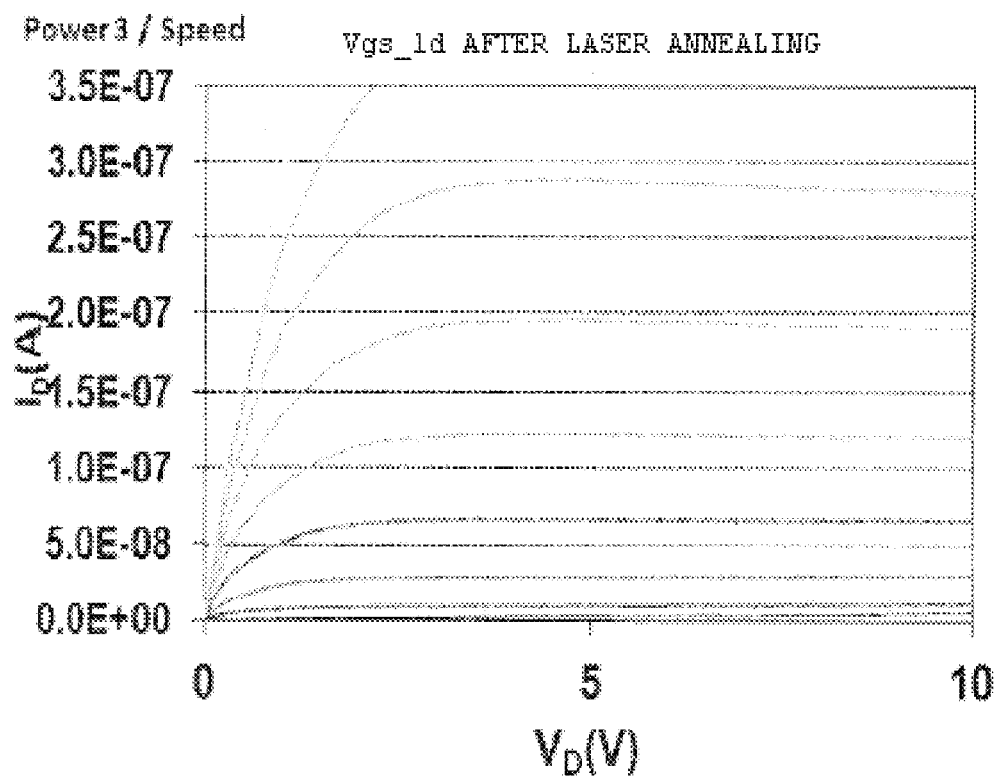

FIGS. 7, 8 and 9 illustrates curves representing characteristics before or after irradiating a laser beam onto a noncrystalline chalcogen compound film.

As illustrated in FIG. 7, it can be known that drain current is different before/after laser annealing and thus mobility is enhanced. In addition, FIG. 8 illustrates drain current before laser annealing, and FIG. 9 illustrates drain current after laser annealing. After laser annealing, a noncrystalline chalcogen compound is recrystallized to a single-crystalline or multiple-crystalline chalcogen compound and thus drain current is further increased.

In another embodiment of the present invention, provided is a method of manufacturing a CMOS-type structure, the method comprising: forming a patterned film of a first transition metal element or a first Group V element on a substrate by patterning and depositing a first n-type transition metal element or the first Group V element on the substrate; forming a patterned film of a second transition metal element or a Second Group V element on a substrate by pattering and depositing a second p-type transition metal element or the second Group V element on the substrate; diffusing the chalcogen element, the chalcogen precursor compound or the chalcogen compound represented by $M'X'_{2+\delta}$ into the patterned film of the first transition metal element or the first Group V element and the patterned film of the second transition metal element or the second Group V element by contacting through vaporization at least one selected from the group consisting of a chalcogen element, a chalcogen precursor compound and a chalcogen compound represented by $M'X'_{2+\delta}$ and combinations thereof with the patterned film of the first transition metal element or the first Group V element and the patterned film of the second transition metal element or the second Group V element; and obtaining a complementary metal oxide semiconductor (CMOS)-type structure comprising an N channel metal oxide semiconductor (NMOS) and a P channel metal oxide semiconductor (PMOS) by forming a chalcogen compound represented by $MX_2$ through post-heating of the patterned film comprising the diffused chalcogen element chalcogen precursor compound or chalcogen compound represented by $M'X'_{2+\delta}$ and thus by forming a patterned film of the chalcogen compound represented by $MX_2$, wherein M is a transition metal element or a Group V element and X is a chalcogen element.

The method of manufacturing a CMOS-type structure is a method of manufacturing a CMOS-type structure from a chalcogen compound using the two-dimensional large-area growth method for a chalcogen compound.

Figure 1:
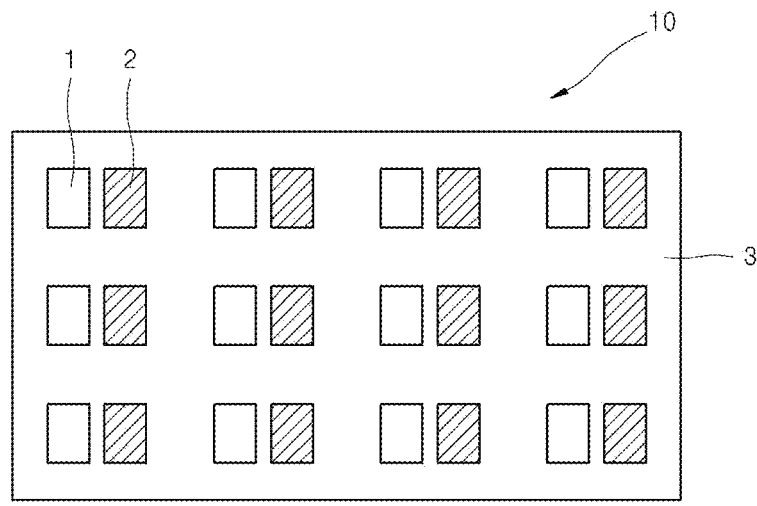
FIG. 1 is a plan view illustrating a CMOS-type structure manufactured by a method of manufacturing a CMOS-type structure according to an embodiment of the present invention.

FIG. 1 illustrates a plan view of an embodiment of a CMOS-type structure manufactured according to the method of manufacturing a CMOS-type structure.

As illustrated in FIG. 1, in order to realize CMOS including a patterned NMOS 1 and PMOS 2, each of an n-type first transition metal element or first Group V element according to a pattern of the NMOS 1 and a p-type second transition metal element or second Group V element according to a pattern of the PMOS 2 is patterned on a substrate and thus patterned deposition films are formed.

FIG. 1 illustrates pattern shapes of the NMOS 1 and the PMOS 2 as an embodiment. The pattern shape of each of the NMOS 1 and the PMOS 2 may be different without limitation depending upon a desired CMOS-type structure.

When, with a substrate on which a patterned deposition film of each of the n-type first transition metal element or first Group V element and the p-type second transition metal element or second Group V element is formed, a chalcogen element or chalcogen compound is contacted through vaporization using the two-dimensional large-area growth method for a chalcogen compound, the chalcogen element, chalcogen precursor compound or a chalcogen compound represented by $M'X'_{2+\delta}$ is diffused into a patterned films 1 and 2.

Detailed descriptions for the first or second transition metal element and the first or second Group V element are the same as those for the transition metal element and the Group V element described in the two-dimensional large-area growth method for a chalcogen compound described above.

Detailed descriptions for a method of diffusing the chalcogen element or chalcogen compound are the same as those for the two-dimensional large-area growth method for a chalcogen compound described above. That is, at least one raw material selected from the chalcogen element, the chalcogen precursor or the chalcogen compound represented by $M'X'_{2+\delta}$ and combinations thereof may be diffused into the patterned films 1 and 2 of the first or second transition metal element or the first or second Group V element through a physical or chemical vapor-phase synthesis method.

In particular, the chalcogen element or the chalcogen compound is used as a raw material, and the vaporized chalcogen element or the vaporized chalcogen compound may be diffused into the patterned films 1 and 2 through a method selected from the group consisting of chemical vapor deposition (CVD), thermal CVD, plasma enhanced chemical vapor deposition (PECVD), low pressure chemical vapor deposition (LPCVD), atomic layer deposition (ALD), pulsed laser deposition (PLD), sputtering and combinations thereof.

Detailed descriptions for the chalcogen element, the chalcogen precursor or the chalcogen compound represented by M'X'$_{2+\delta}$ diffused through vaporization are the same as those for the two-dimensional large-area growth method for a chalcogen compound described above.

The vaporized chalcogen element, chalcogen precursor compound or chalcogen compound represented by M'X'$_{2+\delta}$ diffused into the patterned films 1 and 2 may be migrated by a carrier gas and diffused into the film. Accordingly, the raw material used in the physical or chemical vapor-phase synthesis method may further include a carrier gas.

The carrier gas may include at least one selected from the group comprising iodine (I), bromine (Br) and combinations thereof.

In the patterned film including the diffused chalcogen element, chalcogen precursor compound or chalcogen compound represented by M'X'$_{2+\delta}$, an atom ratio of the chalcogen element to a total of the transition metal element or the Group V element may be greater than 2.

Subsequently, when post-heating is performed, a chalcogen compound represented by $MX_2$ is formed and, at the same time, each of the NMOS 1 and the PMOS 2 is formed, whereby a CMOS-type structure 10 including the NMOS 1 and the PMOS 2 is manufactured.

Detailed descriptions for the chalcogen compound represented by $MX_2$ formed after the post-heating are the same as those for the two-dimensional large-area growth method for a chalcogen compound.

Detailed descriptions for the post-heating are the same as those for the two-dimensional large-area growth method for a chalcogen compound.

In addition, the method of manufacturing a CMOS-type structure may further include recrystallizing the chalcogen compound represented by $MX_2$ by annealing the CMOS-type structure obtained through the post-heating.

The substrate 3 may be at least one selected from the group including a glass substrate, a Si substrate, a quartz substrate, a sapphire substrate and combinations thereof.

The substrate may be a rigid substrate or a flexible substrate.

In another embodiment of the present invention, provided is a film of a chalcogen compound represented by $MX_2$, which is prepared according to the two-dimensional large-area growth method for a chalcogen compound. In the chalcogen compound represented by $MX_2$, M is a transition metal element or a Group V element and X is a chalcogen element.

As described above, the film of the chalcogen compound represented by $MX_2$ may be formed as a large area.

In particular, the film of the chalcogen compound represented by $MX_2$ may be a film of at least one chalcogen compound selected from the group consisting of, $MoS_2$, $MoSe_2$, $WSe_2$, $MoTe_2$, $SnSe_2$ and combinations thereof.

The film of the chalcogen compound represented by $MX_2$ may be a crystalline film having a single-layer structure or a multi-layer structure.

The chalcogen compound represented by $MX_2$ forming the single-layer crystalline film absorbs light through a direct transition band gap, and the chalcogen compound represented by $MX_2$ forming the multi-layer crystalline film absorbs light through an indirect transition band gap.

The chalcogen compound represented by $MX_2$ forming the multi-layer crystalline film may absorbs wavelengths of from a UV area to a near-infrared ray area.

A single-layer $MoS_2$ structure and a transistor having single-layer $MoS_2$ are the same as illustrated in FIGS. 1 and 2. As illustrated in FIG. 1, a single-layer $MoS_2$ crystal has a vertically staked structure and such single layer has a thickness of 6.5 Å and is formed by van der Waals interaction.

Hereinafter, an embodiment of the chalcogen compound represented by $MoS_2$ is described, and difference between a single-layer chalcogen compound and a multi-layer chalcogen compound is described.

Figure 10:
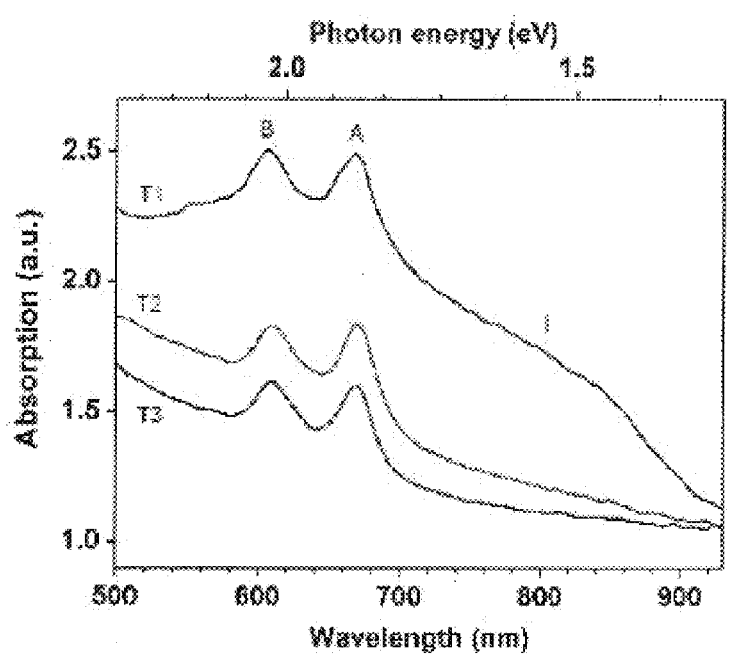
FIG. 10 is a view illustrating absorption spectra of $MoS_2$ crystals, the thicknesses of which are different.

For example, $MoS_2$ as a single-layer chalcogen compound has a unique band gap of 1.8 eV, and unique mobility of the material is 0.5 to 3 $cm^2V^{-1}s^{-1}$. The single-layer $MoS_2$ may absorb a wavelength of below about 700 nm as illustrated as T2 and T3 graphs of FIG. 10. In FIG. 10, T1, T2 and T3 denote the thickness of the $MoS_2$ crystal, and a thickness size order is as follows: foT1>T2>T3. In particular, T1 is about 40 nm, T2 is about 4 nm and T3 is about 1 nm.

Figure 11:
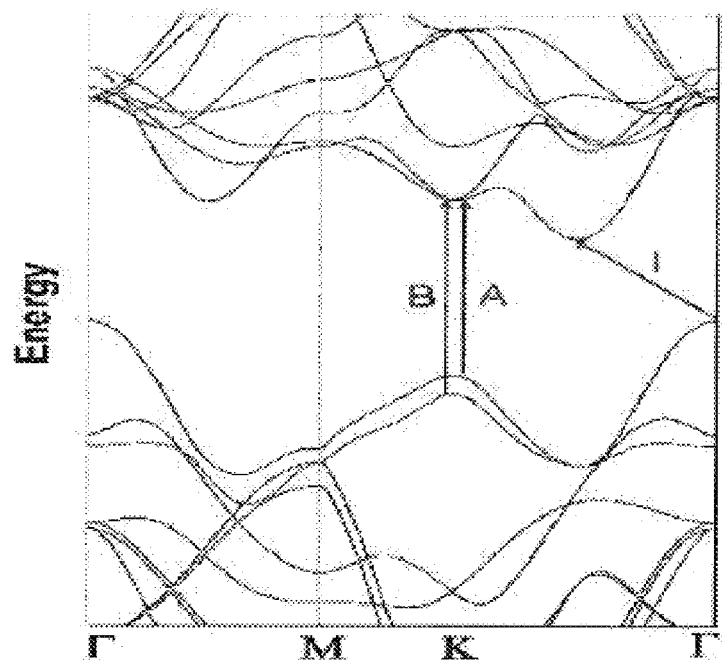
FIG. 11 is a view illustrating a band structure of bulk $MoS_2$.

In FIGS. 10 and 11, "A" and "B" as absorption peaks correspond to a direct transition band gap energy-separated from valance band spin-orbit bonding, a tail "I" corresponds to an indirect transition band gap.

Figure 12:
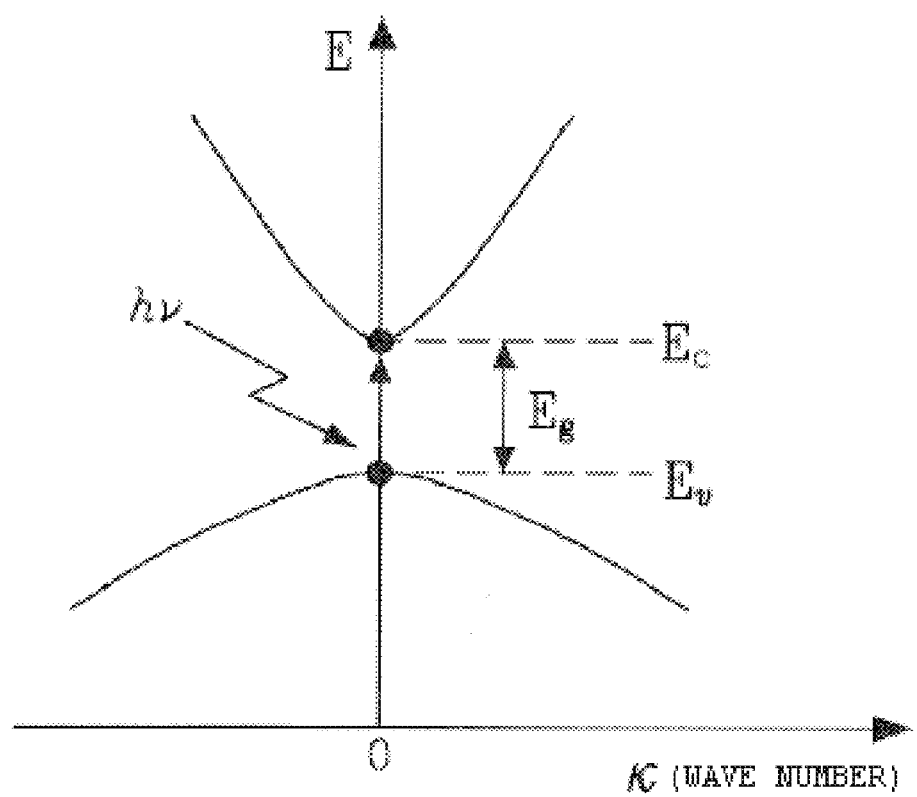
FIG. 12 is a view illustrating an E-k diagram of a direct transition band gap.
Figure 13:
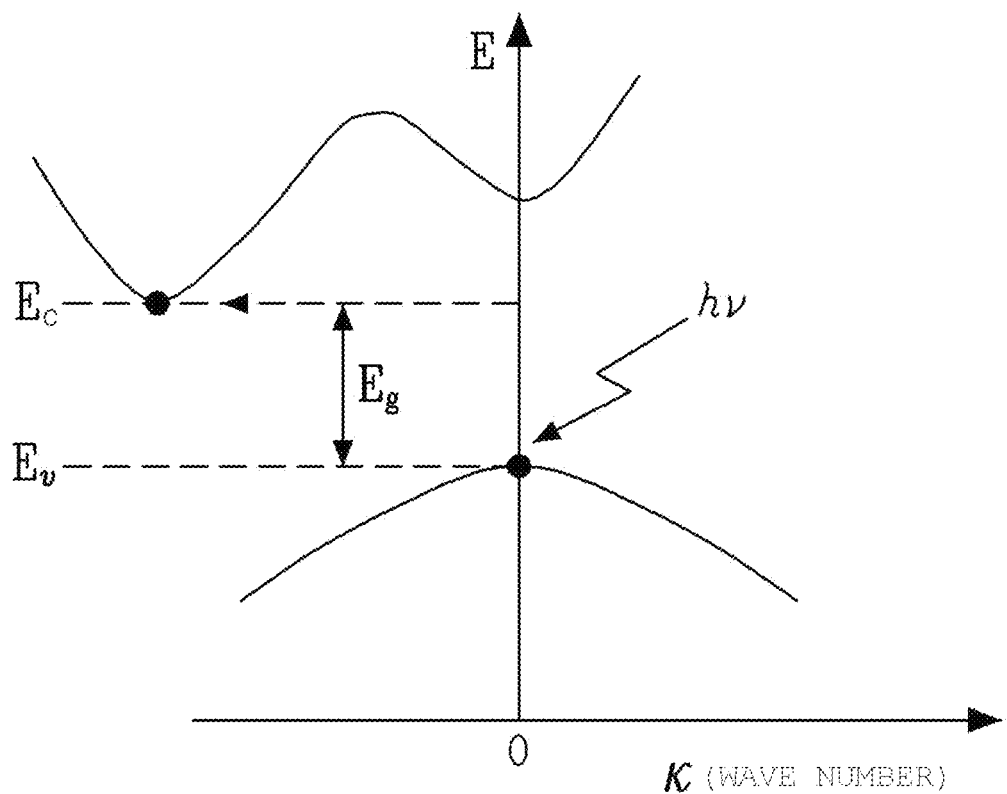
FIG. 13 is a view illustrating an E-k diagram of indirect transition band gap.

Meanwhile, as illustrated in FIG. 12, a direct transition band gap occurs when energy $E_v(k)$ of a valence band is generated as the same wave number k as energy $E_c(k)$ of a conduction band. As illustrated in FIG. 13, an event that two piece of energy is generated as different wave numbers is called an indirect transition band gap. In the direct transition band gap, a valence electron is directly transited to a conduction band by light radiation energy hν, but, in the indirect transition band gap, a valence electron is indirectly transited to a conduction band. In this case, phonon of energy $E_{ph}$ occurs.

Accordingly, in the direct transition band gap, hν=$E_g$, and, in the indirect transition band gap, hν=$E_g$+$E_{ph}$. As such, $E_{ph}$ is generated in the indirect transition band gap and thus an energy gap in a direct transition band gap is lowered from 1.8 eV (single-layer $MoS_2$) to 1.35 eV (multi-layer $MoS_2$). Here, in the case of single-layer $MoS_2$, $MoS_2$ having three layers or more is preferable.

When an energy gap is lowered from 1.8 eV to 1.35 eV, a wavelength value is changed according to Mathematical Equation 1.

$$\lambda = \frac{1.24}{E_g} \qquad \text{Mathematical Equation 1}$$

Energy gaps of 1.8 eV and 1.35 seV are compared. When an energy gap is 1.35 seV, i.e. a small band gap, a wavelength (λ) is increased. Comparing the case of using the single-layer $MoS_2$ and the case of using the multi-layer $MoS_2$, a broader wavelength may be absorbed when the multi-layer $MoS_2$ is used, as illustrated in T1, T2 and T3 graphs of FIG. 10.

In the case of the single-layer $MoS_2$, a wavelength of below 700 nm may be generally absorbed, but, in the multi-layer $MoS_2$ (preferably having three layers or more) according to the present invention, all wavelengths of below 1000 nm may be absorbed, which means that from near-infrared ray (near IR) to UV wavelengths may be detected.

Figure 14:
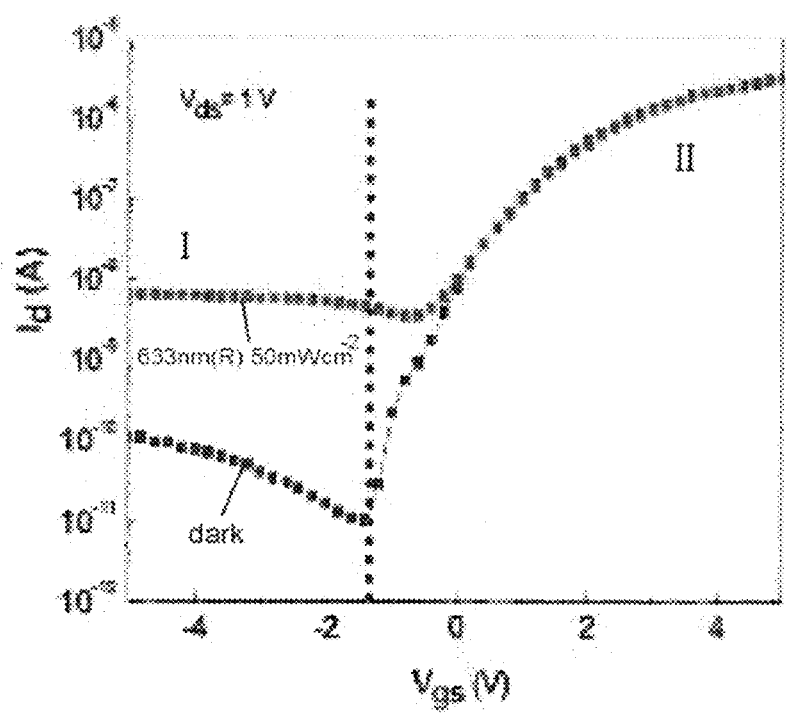
FIG. 14 is a view illustrating Id-Vgs characteristic curves of a $MoS_2$ phototransistor.

In a single-layer or multi-layer chalcogen compound device, $I_d$ difference between when light is not incident and when light is incident (633 nm, strength of 50 $mWcm^{-2}$) is about $10_3$, as illustrated in FIG. 14. Accordingly, the single-layer or multi-layer chalcogen compound device may be used as a switching device.

The film of the chalcogen compound represented by $MX_2$ may be a single-crystalline film or a poly-crystalline film.

In general, solids used in semiconductor are classified into three types, i.e. single-crystalline, poly-crystalline and non-crystalline. Crystalline is defined as a regular molecular arrangement. In single-crystalline, such a regular arrangement is uniformly formed in an overall solid. In poly-crystalline, a crystal is partially formed, but an overall one uniform crystal is formed. Meanwhile, noncrystalline is a solid, but, in noncrystalline, molecular are randomly arranged and there is no regulation. Examples thereof are illustrated as a single-crystalline 10, a poly-crystalline 20 and a noncrystalline 30 in FIG. 15.

Figure 15:
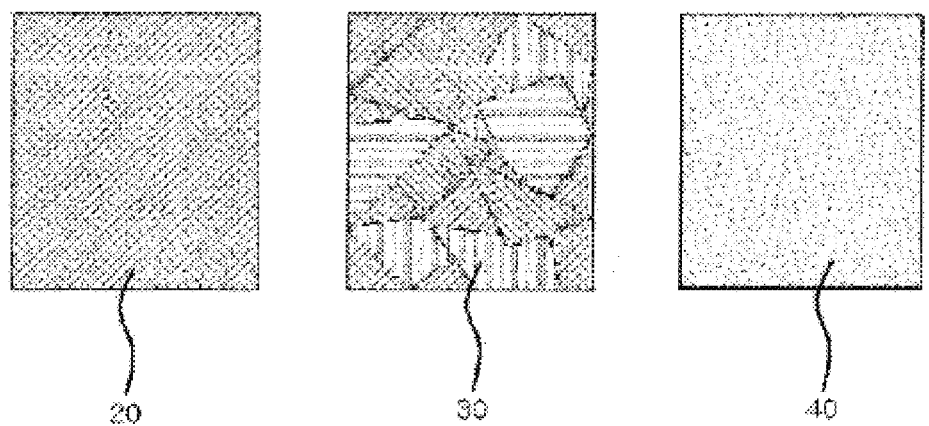
FIG. 15 is a view illustrating three solids.

Here, the single-crystalline is a material formed of one grain, and the poly-crystalline is a material formed of a variety of grains that respectively have a different crystal direction. As illustrated in FIG. 15, in the noncrystalline, molecules are randomly arranged and scattering is generated due to impurities, whereby electron migration becomes slow. Accordingly, when a semiconductor channel is formed using noncrystalline, mobility is poor.

Here, the single-layer or multi-layer chalcogen compound may be formed into a large area through the two-dimensional large-area growth method for a chalcogen compound described above. In addition, as described above, a noncrystalline chalcogen compound may be included according to process temperature conditions. In this case, crystallinity is increased by recrystallizing through an additional annealing process and thus unique mobility of the chalcogen compound may be realized.

As described above, the annealing increases mobility of a material by instantaneously recrystallizing a noncrystalline material to a single-crystalline or poly-crystalline material through, for example, femtosecond laser annealing. The laser annealing may facilitate crystallization of a channel material and enhance electrically conductivity by decreasing contact resistance through application to a bonding portion between a semiconductor and conductor.

In another embodiment of the present invention, an electronic device including a film of the chalcogen compound represented by $MX_2$ prepared according to the two-dimensional large-area growth method for a chalcogen compound is provided. In the chalcogen compound represented by $MX_2$, M is a transition metal element or a Group V element and the X is a chalcogen element.

In particular, the electronic device may be a transistor, a diode, or the like.

In an embodiment, the electronic device is a transistor comprising a plurality of electrodes comprising a gate, a drain and a source, and a semiconductor channel formed between the drain and the source electrode due to the film of the chalcogen compound represented by $MX_2$. In the electronic device, a channel material is formed using the film of a chalcogen compound, and thus, TFT suitable for next-generation displays may be constituted. When a gate, a drain and a source electrode are applied to a transparent electrode, a transparent display having high transmittance may be realized.

In another embodiment of the present invention, a CMOS-type structure manufactured according to the method of manufacturing a CMOS-type structure is provided.

A variety of electronic circuit integrations such as an invertor, a logic element, a memory, a display, a backplane, RF, AC, DC, etc. based on the CMOS-type structure may be formed into a large area.

Now, the present invention will be described in more detail with reference to the following examples. These examples are provided only for illustration of the present invention and should not be construed as limiting the scope and spirit of the present invention.

Example 1

Mo was deposited to a thickness of 20 nm on a Si substrate through thermal CVD and then vaporized Se was diffused into the Mo film using a Se powder and $MoSe_2$ powder as raw materials according to CVD. Subsequently, the Mo film into which the vaporized Se and $MoSe_2$ were diffused was post-heated at 1200° C. for six hours, thereby obtaining a $MoSe_2$ film.

Experimental Example 1

On a $MoSe_2$ film according to Example 1, a Ti/Au electrode was formed as a source-drain, and a transistor film having a $SiO_2$ nonconductor and a Si gate structure was manufactured. Using a semiconductor analyzer (KEITHLEY 4200-SCS) as a current-voltage measurement device, electrical properties of the transistor were evaluated.

Figure 3:
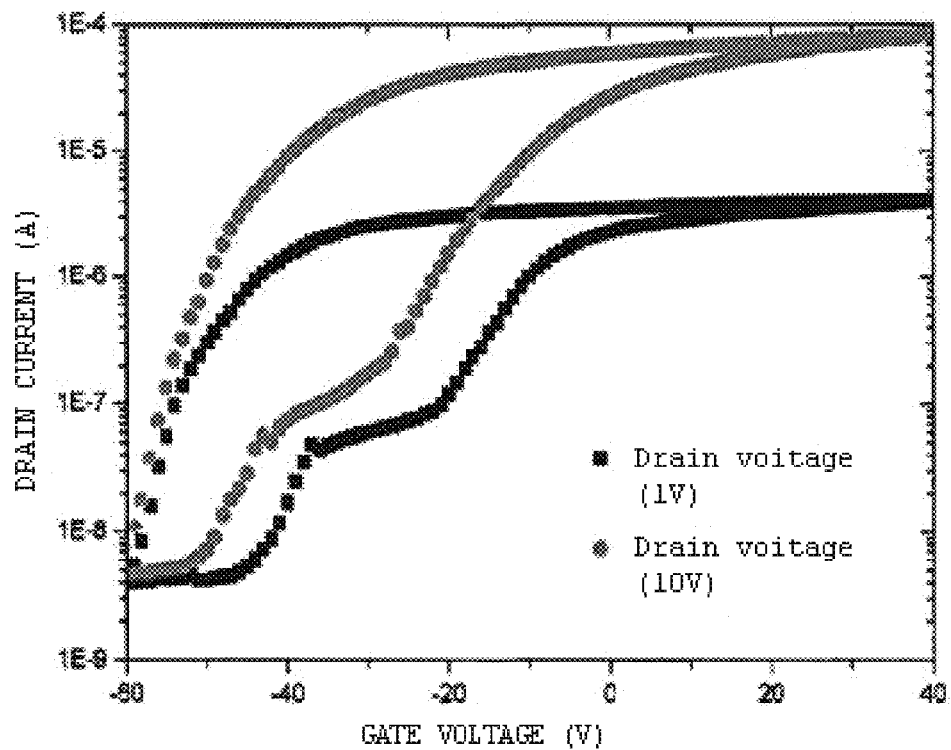
FIG. 3 is a graph illustrating $MoSe_2$ measurement results for films of chalcogen compounds represented by $MX_2$, where M is a transition metal element or a Group V element and X is a chalcogen element, prepared according to Examples 1 and 2, and films according to Comparative Examples 1 to 4.
Figure 4:
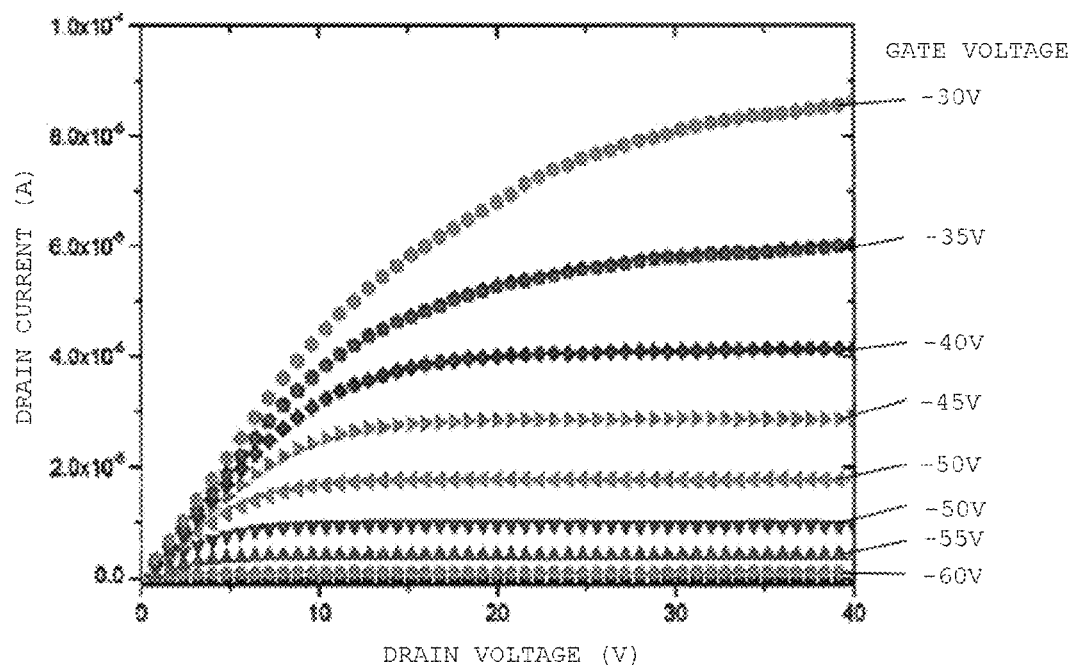
FIG. 4 is a graph illustrating $MoSe_2$ measurement results for films of chalcogen compounds represented by $MX_2$ prepared according to Examples 1 and 2, where M is a transition metal element or a Group V element and X is a chalcogen element, and films according to Comparative Examples 1 to 4.

FIG. 3 illustrates transfer curves of the transistor and FIG. 4 illustrates output curves.

Device mobility was 60 to 100 $cm^2/vsec$ and characteristics of NMOS were exhibited.

As described above, a film of a chalcogen compound represented by $MX_2$, wherein M is a transition metal element or a Group V element and X is a chalcogen element, may be formed into a two-dimensional large-area at high growth speed through a two-dimensional large-area growth method for a chalcogen compound according to the present invention and may exhibit high flexibility and mobility, thereby being usefully used as a next-generation thin film semiconductor material.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

DESCRIPTION OF SYMBOLS

1: NMOS
2: PMOS
3: substrate
100: CMOS-type structure
10: single-crystalline
20: poly-crystalline
30: noncrystalline
40: substrate
50: deposition material
60: laser beam

What is claimed is:

1. A two-dimensional large-area growth method for a chalcogen compound, the method comprising:
   forming a film of a transition metal element or a Group V, or Group VI element by depositing the transition metal element or the Group V, or Group VI element on a substrate;

diffusing the chalcogen element, the chalcogen precursor compound or the chalcogen compound represented by $M'X'_{2+\delta}$ into the film of the transition metal element or the Group V, or Group VI element by contacting through vaporization at least one selected from the group consisting of a chalcogen element, a chalcogen precursor compound and a chalcogen compound represented by $M'X'_{2+\delta}$ and combinations thereof with the film of the transition metal element or the Group V, or Group VI element, wherein M' is a transition metal element or a Group V, or Group VI element, X' is a chalcogen element, and $0 \leq \delta \leq 0.5$; and forming a film of the chalcogen compound represented by $MX_2$ by post-heating the film of the transition metal element or the Group V, or Group VI element including the resultant diffused chalcogen element, chalcogen precursor compound or chalcogen compound represented by $M'X'_{2+\delta}$, wherein M is a transition metal element or a Group V, or Group VI element and X is a chalcogen element, wherein, in the film of the transition metal element or the Group V, or Group VI element comprising the diffused chalcogen element, precursor compound or chalcogen compound represented by $M'X'_{2+\delta}$, an atom ratio of the chalcogen element to the transition metal element or the Group V element is greater than 2.

2. A method of manufacturing a CMOS-type structure, the method comprising:

forming a patterned film of a first transition metal element or a first Group V element on a substrate by patterning and depositing a first n-type transition metal element or the first Group V, or Group VI element on the substrate;

forming a patterned film of a second transition metal element or a second Group V, or Group VI element on a substrate by patterning and depositing a second p-type transition metal element or the second Group V element on the substrate;

diffusing the chalcogen element, the chalcogen precursor compound or the chalcogen compound represented by $M'X'_{2+\delta}$ into the patterned film of the first transition metal element or the first Group V element and the patterned film of the second transition metal element or the second Group V element by contacting through vaporization at least one selected from the group consisting of a chalcogen element, a chalcogen precursor compound and a chalcogen compound represented by $M'X'_{2+\delta}$ and combinations thereof with the patterned film of the first transition metal element or the first Group V element and the patterned film of the second transition metal element or the second Group V element, wherein M' is a transition metal element or a Group V element, X' is a chalcogen element, and $0 \leq \delta \leq 0.5$; and obtaining a complementary metal oxide semiconductor (CMOS)-type structure comprising an N channel metal oxide semiconductor (NMOS) and a P channel metal oxide semiconductor (PMOS) by forming a chalcogen compound represented by $MX_2$ through post-heating of the patterned film comprising the diffused chalcogen element chalcogen precursor compound or chalcogen compound represented by $M'X'_{2+\delta}$ and thus by forming a patterned film of the chalcogen compound represented by $MX_2$, wherein M is a transition metal element or a Group V element and X is a chalcogen element.

3. The method according to claim 2, wherein the vaporized chalcogen element, chalcogen precursor compound, or chalcogen compound represented by $M'X'_{2+\delta}$ vaporized into the patterned film through a physical or chemical vapor-phase synthesis method is diffused using at least one raw material selected from the chalcogen element, the chalcogen precursor or the chalcogen compound represented by $M'X'_{2+\delta}$ and combinations thereof.

4. The method according to claim 2, wherein the vaporized chalcogen element, chalcogen precursor compound or chalcogen compound represented by $M'X'_{2+\delta}$ diffused into the patterned films is migrated by a carrier gas and diffused into the film.

5. The method according to claim 2, wherein, in the patterned film comprising the diffused chalcogen element, precursor compound or chalcogen compound represented by $M'X'_{2+\delta}$, an atom ratio of the chalcogen element to a total of the transition metal element or the Group V element is greater than 2.

6. The method according to claim 2, further comprising recrystallizing the chalcogen compound represented by $MX_2$ by annealing the CMOS-type structure obtained through the post-heating.

* * * * *